(12) United States Patent
Burke et al.

(10) Patent No.: US 7,508,052 B2
(45) Date of Patent: Mar. 24, 2009

(54) CRACK PROTECTION FOR SILICON DIE

(75) Inventors: Hugo R. G. Burke, Wales (GB); Aram Arzumanyan, Burbank, CA (US)

(73) Assignee: International Rectifier Corporation, El Segundo, CA (US)

( * ) Notice: Subject to any disclaimer, the term of this patent is extended or adjusted under 35 U.S.C. 154(b) by 154 days.

(21) Appl. No.: 11/141,859

(22) Filed: Jun. 1, 2005

(65) Prior Publication Data

US 2005/0269720 A1 Dec. 8, 2005

Related U.S. Application Data

(60) Provisional application No. 60/576,701, filed on Jun. 3, 2004.

(51) Int. Cl.
*H01L 23/544* (2006.01)
(52) U.S. Cl. .............. 257/620; 257/E23.001; 257/E23.194; 438/110; 438/113; 438/454; 438/458; 438/460; 438/462; 438/464
(58) Field of Classification Search ............ 257/620, 257/E23.001, E23.194; 438/454, 113, 460, 438/462, 110, 458, 464
See application file for complete search history.

(56) References Cited

U.S. PATENT DOCUMENTS

| 5,024,970 | A | * | 6/1991 | Mori | ............ 438/462 |
| 5,844,304 | A | * | 12/1998 | Kata et al. | ............ 257/620 |
| 6,365,958 | B1 | * | 4/2002 | Ibnabdeljalil et al. | ....... 257/620 |
| 2003/0100143 | A1 | * | 5/2003 | Mulligan et al. | ............ 438/113 |
| 2005/0116333 | A1 | * | 6/2005 | Akiyama | ............ 257/698 |

* cited by examiner

*Primary Examiner*—Davienne Monbleau
*Assistant Examiner*—Christopher M Roland
(74) *Attorney, Agent, or Firm*—Ostrolenk, Faber, Gerb & Soffen, LLP

(57) ABSTRACT

A wafer containing a plurality of die separated by streets which are to be sawn has a nitride passivation layer which has openings over die contact locations and gaps leaving nitride strips along the streets. The gaps in the nitride along the streets expose an oxide, preferably TEOS. A nickel/gold plate contact material overlies the nitride layer and contacts the exposed die contact areas but does not adhere to either the nitride surface or the oxide surfaces. A saw blade can then cut along the streets without being gummed by the metalizing and without producing cracks which propagate into the die termination areas.

9 Claims, 2 Drawing Sheets

CRACK PROTECTION FOR SILICON DIE

RELATED APPLICATIONS

This application claims the benefit of U.S. Provisional Application No. 60/576,701, filed Jun. 3, 2004.

FIELD OF THE INVENTION

This invention relates to silicon wafer processing and more specifically relates to a wafer structure and process to prevent cracking of the die when they are singulated, or separated from the wafer.

BACKGROUND OF THE INVENTION

In the manufacture of semiconductor die such as diodes or MOSFETs or the like, the die structures are completed to the extent possible in a common wafer and are then singulated (separated) as by sawing in a scribe area ("streets") between and circumscribing adjacent die.

In many semiconductor device products, such as the Flip Fet™ flip chip MOSFET of U.S. Pat. No. 6,653,740 which is owned by the assignee of the present invention, the die are not packaged and need to be otherwise passivated from ambient. For that purpose, and while the die are still in the wafer a silicon nitride ($Si_3N_4$) layer about 1.2 microns thick is applied to the wafer surface after the front metal has been applied to the die in the wafer. A PECVD process is conventionally used to deposit the nitride layer. The nitride passivation layer was then subjected to a photolithography step in which a mask was processed and opened only to expose the scribe lines which circumscribe each of the die and the contact regions to which contacts (for contact balls in the case of the device of U.S. Pat. No. 6,653,740) are to be formed on the passivated die.

After masking, the exposed nitride areas are dry-etched and the photoresist was stripped.

To then prepare the surface for solder ball formation, the first step was an electroless Ni/Au plating step over the full wafer surface. The plating adheres only to the exposed areas opened in the passivation layer so that the scribe lines were also plated along with the solder ball electrode pads.

As a result, during dicing or singulation of the die from the wafer, the saw blade became clogged or gummed up by the Ni/Au plate layer.

In an attempt to solve this problem, an oxide (TEOS) film (the surface of the wafer has an overlying TEOS layer beneath the nitride passivation) was left on the streets (after the etch of the nitride). This protected the streets from plating of Ni/Au, but a new problem was created. Thus, the TEOS film was cracking during dicing, with some cracks propagating into the die termination areas.

To solve this problem, the TEOS was removed from the street and a street protection photoresist mask was added to protect the streets from plating. This mask was then stripped with hot sulfuric acid after the plating operation. However, with this process, some of the exposed metals of the wafer were also etched, and the additional photo steps added cost to the process.

BRIEF DESCRIPTION OF THE INVENTION

In accordance with the invention, the nitride passivation over the streets is bordered on each side by oxide strips which interrupt and underlie and segregate a nitride strip over the street.

Thus, the nitride strip over the street prevents the deposit of the Ni/Au plate (or some other contact layer), and cracks in the nitride due to sawing propagate through the nitride but stop at the oxide border strips and do not go into the die termination areas.

One process to accomplish the boarder oxide strips employs a slight change in the contact mask which leaves spaced narrow (10 micron wide) oxide strips on each side of the street area unetched. The nitride passivation layer is then etched off the tops of the border oxide strips, leaving about a 6 micron wide opening over the 10 micron wide oxide strips. Thus, the nitride passivation is non-continuous, but protects the silicon in the street from being plated by the Ni/Au plating.

DETAILED DESCRIPTION OF THE PREFERRED EMBODIMENT

Figure 1:
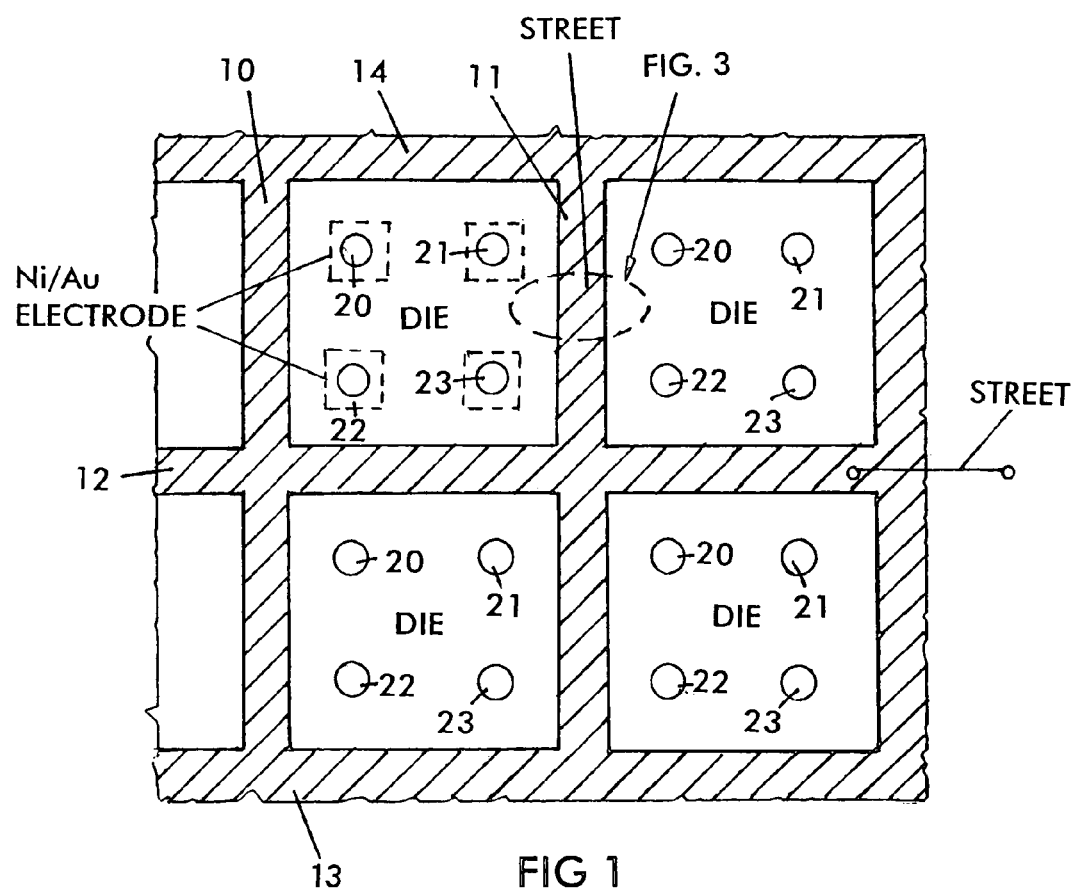
FIG. 1 is a top view of a wafer containing plural identical die which are simultaneously processed to contain any desired junction pattern and electrode structure.
Figure 3:
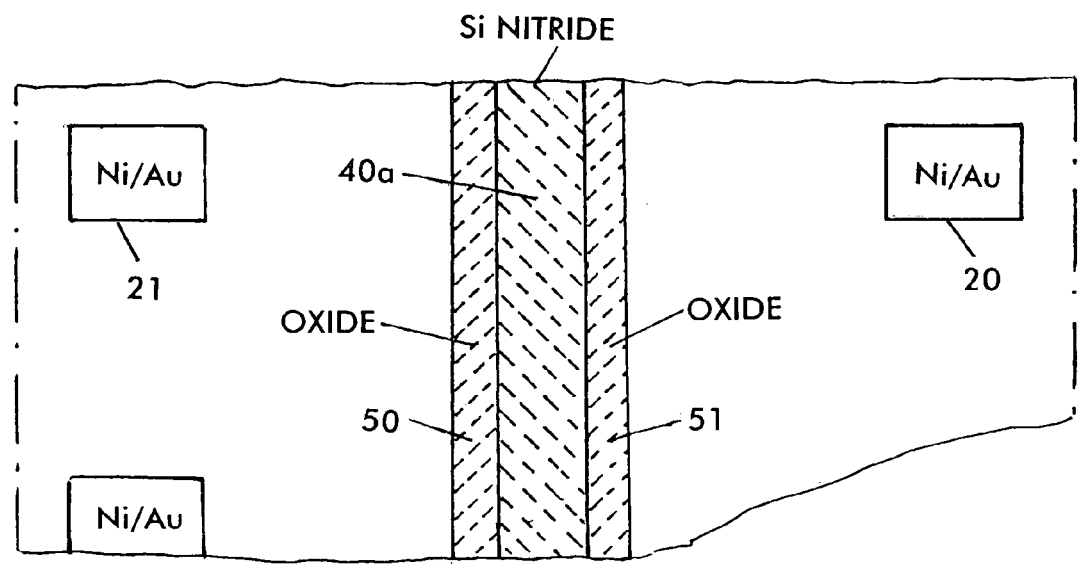
FIG. 3 is a top view of FIG. 2.

FIG. 1 shows a conventional wafer, for example a monocrystalline silicon wafer, after a plurality of identical die, which may be transistors, diodes, or the like, have been fully processed, and the die are ready to be singulated as by a saw cut through the streets 10 through 14 which circumscribe the die. Note that each of the die are shown as having contact bumps such as bumps 20, 21, 22 and 23 which are connected to various die electrodes which have been formed in the wafer during manufacturing stage. Such die may be Flip Fet die of the type shown in U.S. Pat. 6,653,740 (IR-1696) which is incorporated herein in its entirety, by reference.

Figure 2:
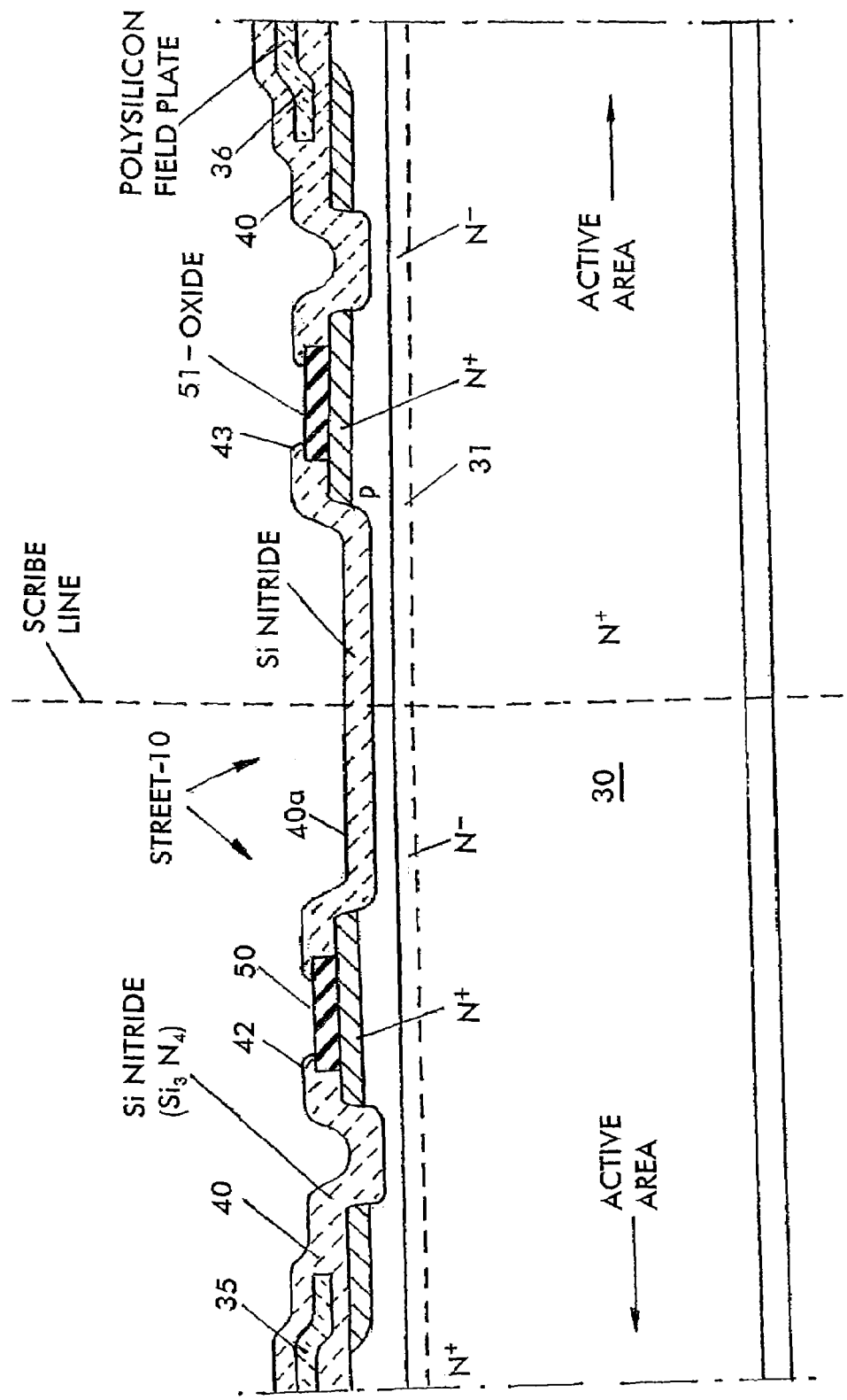
FIG. 2 is a cross-section of the street between adjacent die which is to be scribed or sawn to separate (or singulate) the die.

FIG. 2 is a cross-section of a termination area and street area of two adjacent die in FIG. 1, identified roughly by the circled area labeled "FIG. 2" in FIG. 1. The wafer has an $N^+$ body 30 (any conductivity type can be used) with a junction-receiving $N^-$ epitaxially grown layer 31 thereon. The junction pattern and electrodes connected thereto can take any desired form and are not shown in FIG. 2, but can be those shown in U.S. Pat. No. 6,653,740 previously identified.

The termination shown includes polysilicon field plate layers 35 and 36. These are not critical to the invention.

The full wafer is passivated by a nitride ($Si_3N_4$) layer 40 which is opened in areas of the device to be metallized. Thus, in order to attach the solder balls 20 to 23 in FIG. 1, a nickel gold layer is first deposited on the die electrodes through windows in the nitride layer (shown in dotted lines in FIG. 1). The nitride layer 40 is left in place over the termination area to prevent plating of the metal in this area which would gum up the saw blade. However, the nitride, which will not gum the blade, has been found to propagate cracks into the die termination areas during sawing.

In accordance with the invention, the nitride layer 40 is removed at narrow elongated gaps 42 and 43 which border a central nitride strip 40a (FIG. 2). The gaps 42 and 43 contain elongated oxide (TEOS) strips 50 and 51, respectively. The TEOS strips 50 and 51 may be portions of a TEOS layer over the full wafer which is etched during the contact etch to expose windows for connection of balls 20 to 23. The strips 50 and 51 can be left in place by a simple change in the contact mask.

Note that the oxide layers 50 and 51 may have a width of about 10 microns and may be overlapped along their edges by the nitride layer. The gaps in the nitride may be about 6 microns wide.

When the Ni/Au electroless plate layer is now applied, it will not adhere to any of the oxide or nitride surfaces in the street area of FIG. 2. Thus, the die can be sawn along the center of nitride strip 40 (without clogging the saw blade) and cracks which may propagate from nitride layer 40a will not propagate past the oxide border strips 50 and 51 and into the die terminations.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A wafer of semiconductor material having a plurality of identical laterally spaced die areas thereon which are surrounded by streets to be sawn to separate the die; said wafer having a surface passivation layer of nitride thereon; said surface passivation layer having openings therethrough at locations of electrodes on said die to permit the formation of contacts to said electrodes, said surface passivation layer having spaced parallel gaps on the borders of said streets separating said streets from said openings to leave a strip of nitride over each of said streets; each of said gaps having an oxide strip therein bordered on at least two sides by the surface passivation layer; whereby said streets can be sawn to singulate said die without propagation of cracks into a termination area of said die.

2. The wafer of claim 1, wherein said semiconductor material is monocrystalline silicon.

3. The wafer of claim 2, wherein said surface passivation layer is $Si_3N_4$.

4. The wafer of claim 3, wherein said oxide strip is TEOS.

5. The wafer of claim 4, wherein said electrodes are a nickel/gold plating.

6. The wafer of claim 1, wherein said surface passivation layer is $Si_3N_4$.

7. The wafer of claim 1, wherein said oxide strip is TEOS.

8. The wafer of claim 1, wherein said electrodes receive a nickel/gold plating.

9. The wafer of claim 1, wherein the surface passivation layer overlies at least a portion of the oxide strip.

* * * * *